(12) United States Patent
Shih et al.

(10) Patent No.: US 7,948,085 B2
(45) Date of Patent: May 24, 2011

(54) CIRCUIT BOARD STRUCTURE

(75) Inventors: Chao-Wen Shih, Hsin-Chu (TW);
Zhao-Chong Zeng, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 132 days.

(21) Appl. No.: 12/016,593

(22) Filed: Jan. 18, 2008

(65) Prior Publication Data

US 2008/0176035 A1 Jul. 24, 2008

(30) Foreign Application Priority Data

Jan. 24, 2007 (TW) .............................. 96102614 A

(51) Int. Cl.
*H05K 1/02* (2006.01)
*H05K 3/00* (2006.01)
*B32B 3/10* (2006.01)

(52) U.S. Cl. ................ 257/758; 257/E23.141; 257/700; 257/701; 257/668; 257/774; 257/778; 257/737; 257/738; 174/50; 428/131; 427/97.6

(58) Field of Classification Search .................. 257/758, 257/700, 701, 774, 668, 702, 784, 786, 737, 257/738, 778, E23.141; 174/50; 428/131; 427/97.6
See application file for complete search history.

(56) References Cited

U.S. PATENT DOCUMENTS

| | | | | |
|---|---|---|---|---|
| 5,821,031 A * | 10/1998 | Hashimoto et al. | ......... | 430/280.1 |
| 5,827,780 A * | 10/1998 | Hsia et al. | ..................... | 438/692 |
| 5,914,211 A * | 6/1999 | Hashino et al. | ............... | 430/166 |
| 5,916,738 A * | 6/1999 | Takehana et al. | ............. | 430/323 |
| 6,171,967 B1 * | 1/2001 | Jun | ................ | 438/700 |
| 6,238,840 B1 * | 5/2001 | Hirayama et al. | ......... | 430/280.1 |
| 6,238,841 B1 * | 5/2001 | Morigaki | .................... | 430/280.1 |
| 6,727,042 B2 * | 4/2004 | Takagi et al. | ............... | 430/280.1 |
| 7,291,517 B2 * | 11/2007 | Sakurai et al. | ................ | 438/106 |
| 2001/0004134 A1 * | 6/2001 | Saitoh | .......................... | 257/759 |
| 2002/0004180 A1 * | 1/2002 | Hotta et al. | .................... | 430/311 |
| 2003/0064304 A1 * | 4/2003 | Ono et al. | ........................ | 430/14 |
| 2005/0147766 A1 * | 7/2005 | Aoki | .............................. | 427/532 |
| 2006/0110907 A1 * | 5/2006 | Sakurai et al. | ................ | 438/612 |
| 2007/0241457 A1 * | 10/2007 | Ida | ................................ | 257/738 |
| 2008/0217047 A1 * | 9/2008 | Hu | ................................... | 174/257 |
| 2008/0277150 A1 * | 11/2008 | Takashima et al. | ............ | 174/260 |
| 2008/0299787 A1 * | 12/2008 | Chung et al. | ..................... | 439/56 |
| 2009/0173523 A1 * | 7/2009 | Hirose et al. | ................... | 174/255 |
| 2009/0242262 A1 * | 10/2009 | Asano | ............................ | 174/267 |
| 2010/0066230 A1 * | 3/2010 | Lin et al. | .......................... | 313/11 |
| 2010/0163288 A1 * | 7/2010 | Zhong et al. | .................... | 174/258 |

* cited by examiner

*Primary Examiner* — Alexander O Williams
(74) *Attorney, Agent, or Firm* — Pearne & Gordon LLP

(57) ABSTRACT

A circuit board structure and a fabrication method of the same are disclosed according to the present invention. The circuit board structure includes: a carrier board with at least one surface formed with a circuit layer having electrically connecting pads; a first solder mask formed on the carrier board and the circuit layer and formed with first openings for exposing the electrically connecting pads; and a second solder mask formed on the first solder mask and formed with second openings for exposing the first openings and the electrically connecting pads. The first solder mask is made of a high-insulation photosensitive material characterized by presence or absence of impurities, such as microparticles, to have enhanced fluidity for being filled in the circuit layer, thereby preventing metal ions migration and subsequent metal hypha electricity discharge which might otherwise affect electrical performance, therefore the present invention is applicable to fine circuit fabrication.

6 Claims, 6 Drawing Sheets

CIRCUIT BOARD STRUCTURE

BACKGROUND OF THE INVENTION

1. Field of the Invention

The present invention generally relates to circuit board structures and fabrication methods of the same, and more specifically, to a circuit board structure with fine circuits and a fabrication method of the same.

2. Description of Related Art

Owing to the evolution of semiconductor package technology, different package models of semiconductor devices have been developed. A traditional method for fabricating semiconductor devices comprises the following steps: mounting a semiconductor element, e.g. an integrated circuit, on a package substrate or a leadframe; electrically connecting the semiconductor element to the package substrate or the leadframe and performing encapsulation with an encapsulant; wherein ball grid arrays (BGAs), such as PBGA, EBGA, FCBGA, and others, are advanced semiconductor package technologies applied. The features of these technologies are: mounting a semiconductor element on one side of a packaging substrate; implanting a plurality of solder balls on the other side of the packaging substrate in a grid array pattern, thus allowing a carrier board of the semiconductor element to be capable of accommodating more input/output connections within the same unit area and thereby meeting demands for high integration of semiconductor chips, wherein the semiconductor element can be entirely soldered and electrically connected to external electronic devices via the solder balls.

To meet operational requirements for high-performance chips, such as microprocessors, chip sets, and graphic chips, it is necessary to enhance the functions of wired circuit boards regarding, for example, chip signal transmission, bandwidth, and impedance control, in order to accordingly answer to the trends of high I/O number packages. However, to fit in with the developing trend of semiconductor package towards light weight, small size, multiple functions, high speed, and high frequency, circuit boards for packaging semiconductor chips have been trending towards fine lines and small apertures; size of a circuit lines of the present circuit board, including line width, pitches between lines, aspect ratio, and etc., has been reduced from traditional 100 μm to 30 μm, and the developing trend is continuously towards smaller lines with great precision.

In order to enhance wiring layout precision of a circuit boards applied in semiconductor chip packages, semiconductor industry has developed build-up technology, namely a plurality of dielectric layers as well as circuit layers are alternately laid on a core circuit board by means of a circuit layers build-up technology, and then a plurality of conductive vias are formed in the dielectric layers for providing electrical connections among the circuit layers; in addition, a solder mask is formed on top of the topmost circuit layer to protect circuit layers thereunder, and the solder mask has a plurality of openings for exposing electrically connecting pads on the topmost circuit layer.

Please refer to FIGS. 1A through 1C, which are cross-sectional views of a fabrication method of a known circuit board with multiple circuit layers; first, as shown in FIG. 1A, provide a carrier board 10, which is a circuit board thereon a circuit layer 11 has already be fabricated, and the circuit layer 11 has at least one electrically connecting pad 110; an then, as shown in FIG. 1B, form a solder mask 12 on surfaces of the circuit layer 11 and the carrier board 10, a general thickness thereof is 21 μm; at last, as shown in FIG. 1C, have the solder mask 12 go through a patterning process of exposing, developing, etching, etc., thus a plurality of openings 120 are formed in the solder mask 12 to expose the electrically connecting pads 110 of the circuit layer 11.

However, in the aforementioned fabrication process of solder mask on the surface of the circuit board with multiple circuit layers, the solder mask 12 is made of impure material that has impurities, such as macroparticles of about 10 μm in diameter, therefore when the solder mask 12 is formed on the surface of the carrier board 10 that has circuit layer 11, fluidity and filling property of the solder mask 12 are greatly affected by the impurities thereof, and consequently the solder mask 12 cannot completely permeate through gaps within the circuit layer 11 between lines, between line and electrically connecting pad, as well as between electrically connecting pads. The gaps must be widened in order to be filled with the solder mask. Therefore, the pitches between lines must be enlarged in a wiring process, and then area on the circuit board available for wiring is consequently reduced. The outcome is definitely a disadvantageous situation for fabricating circuit of fine lines.

Besides, the solder mask 12 with macroparticles has relatively poor insulation and a relatively high dielectric constant, thus migration of metal atoms of the circuit layer 11 in the solder mask 12 is likely to happen, and consequently impedance between lines will not fit in with product specification, and then electric signal interference between lines happens; in a worse scenario of migration of metal atoms, the solder mask 12 will produce metal hyphae, in such situation, when the circuit layer 11 is electrified, terminals of the metal hyphae tend to discharge electricity, consequently electricity quality and capability of the circuit are greatly diminished; it is obviously that the pitches between lines should be spacious enough to prevent migration of metal atoms from happening, therefore the demand for applying fine circuit lines cannot be reached.

In view of the above, it is a highly urgent issue in the industry for how to provide a circuit board structure and a fabrication method of the same, which can effectively prevent metal atoms from migrating in the solder mask as well as prevent metal hyphae from discharging electricity caused by poor fluidity and filling property of the solder mask due to macroparticles thereof as happened in prior art, and can avoid disadvantage of being unfit to fabricate circuit boards with fine circuit lines.

SUMMARY OF THE INVENTION

In view of the disadvantages of the prior art mentioned above, it is a primary objective of the present invention to provide a circuit board structure and a fabrication method of the same, which are capable of avoiding drawbacks of inefficient insulation of lines caused by poor fluidity and filling of a solder mask.

It is another objective of the present invention to provide a circuit board structure and a fabrication method of the same, which are capable of enhancing insulating property of the solder mask.

It is a further objective of the present invention to provide a circuit board structure and a fabrication method of the same, which are capable of decreasing migration of metal atoms in the solder mask.

It is still another objective of the present invention to provide a circuit board structure and a fabrication method of the same, which are capable of preventing the solder mask from producing metal hyphae, and then further preventing the latter from discharging electricity.

To achieve the aforementioned and other objectives, a circuit board structure is provided according to the present invention. The circuit board structure comprises: a carrier board with at least one surface formed with a circuit layer, the circuit layer having a plurality of electrically connecting pads; a first solder mask formed on the surfaces of the carrier board and the circuit layer and formed with a plurality of first openings to expose the electrically connecting pads; and a second solder mask formed on the surface of the first solder mask and formed with a plurality of second openings to correspondingly expose the first openings and the electrically connecting pads thereunder.

In accordance with the aforementioned structure, the present invention further comprises conductive elements formed on the surfaces of the electrically connecting pads inside the first and the second openings, and a conductive layer formed between the electrically connecting pads and the conductive elements. The conductive elements are solder balls or conductive bumps.

The first solder mask is made of a high-insulation photosensitive material characterized by presence or absence of impurities, such as microparticles, thereby enhancing fluidity and filling property of the solder mask for being filled in the circuit layers as well as preventing metal ions migration and subsequent metal hypha electricity discharge which might otherwise affect electrical performance. Therefore, the present invention is applicable to fine circuit fabrication.

The circuit board structure of the present invention further comprises a semiconductor chip with electrode pads. The electrode pads have bumps formed thereon. The bumps are electrically connected to the conductive elements via a conductive material. A bottom glue is formed between the semiconductor chip and the second solder mask.

The present invention further provides a fabrication method of a circuit board structure, the fabrication method comprises the steps of: providing a carrier board having a circuit layer formed on at least one surface of the carrier board, the circuit layer having a plurality of electrically connecting pads; forming a first solder mask on top of the carrier board and the circuit layer such that the first solder mask is higher than the top of the circuit layer, forming a plurality of first openings in the first solder mask by a patterning process to expose the electrically connecting pads; and forming a second solder mask on the first solder mask, forming a plurality of second openings in the second solder mask by a patterning process to correspondingly expose the first openings and the electrically connecting pads thereunder.

The abovementioned fabrication method of the present invention further comprises the steps of: forming a conductive layer on the surface of the second solder mask, the first openings, the second openings, and the electrically connecting pads; forming a resist layer on the surface of the conductive layer, and then forming a plurality of third openings in the resist layer by a patterning process to expose the conductive layer inside the first and the second openings; inside each third opening, forming conductive elements, such as solder balls and conductive bumps, on the surfaces of the resist layer as well as the conductive layer inside the first and the second openings by electroplating; and removing the resist layer and the conductive layer covered therewith.

The present invention further provides another fabrication method of a circuit board structure, which comprises: providing a carrier board having a circuit layer formed on at least one surface of the carrier board, the circuit layer having a plurality of electrically connecting pads; forming a first solder mask on top of the carrier board and the circuit layer such that the first solder mask is higher than the top of the circuit layer; forming a second solder mask on top of the first solder mask; forming a plurality of solder mask openings penetrating the first and the second solder masks by a patterning process to expose the electrically connecting pads; in accordance with the fabrication method mentioned above, further comprises: forming a conductive layer on the surfaces of the second solder mask, the openings of the solder mask, and the electrically connecting pads; forming a resist layer on top of the conductive layer, and then forming a plurality of resist layer openings in the resist layer by a patterning process to expose the solder mask openings and the conductive layer on the electrically connecting pads; inside the resist layer openings, forming conductive elements, such as solder balls and conductive bumps, on the surface of the conductive layer inside the resist layer opening and the solder mask opening and on the electrically connecting pad by electroplating; and removing the resist layer and the conductive layer covered therewith.

The first solder mask is made of a high-insulation photosensitive material characterized by presence or absence of impurities, such as microparticles, thereby enhancing fluidity and filling property of the solder mask for being filled in the circuit layers as well as preventing metal ions migration and subsequent metal hypha electricity discharge which might otherwise affect electrical performance. Therefore, the present invention is applicable to fine circuit fabrication In view of the above, the circuit board structure and a fabrication method of the same according to the present invention involves forming a first solder mask, which exhibits high insulation and enhanced fluidity, on the surface of a carrier board to permeate through a circuit layer, thus providing complete separations between line and line, line and electrically connecting pad, as well as electrically connecting pad and electrically connecting pad, further preventing metal ions migration and subsequent metal hyphae electricity discharge which might otherwise affect electrical performance. Therefore, the present invention is applicable to fine circuit layer fabrication. In addition, the second solder mask which is waterproof is further formed on top of the first solder mask provides the circuit layer covered under the first solder mask with well protection against vapor, also the total thickness of the first and the second solder masks is less than the thickness of a known single-layered solder mask, thus the present invention provides designs of fine pitches between conductive elements, decreases the overall thickness of a fabricated circuit board structure, applies to fine circuit layer fabrication, and consequently reduces total fabrication cost.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by persons skilled in the art after reading the disclosure of this specification. The present invention can also be performed or applied by other different embodiments. The details of the specification may be modified on the basis of different points and applications, and numerous modifications and variations can be devised without departing from the spirit of the present invention.

First Embodiment

Please refer to FIGS. 2A through 2I, which are cross-sectional views illustrating the first embodiment of a fabrication method of a circuit board structure according to the present invention.

Figure 1A:
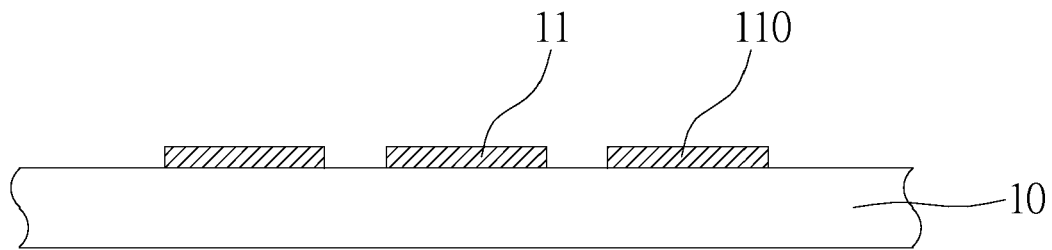
FIGS. 1A through 1C (PRIOR ART) are cross-sectional views of a conventional circuit board with multiple circuit layers, thereon a solder mask is formed.
Figure 1B:
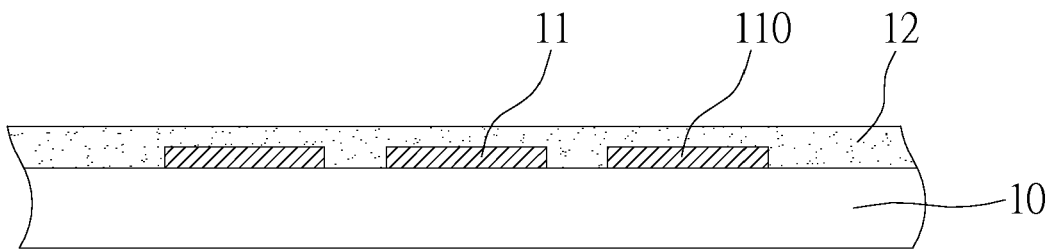
Figure 1C:
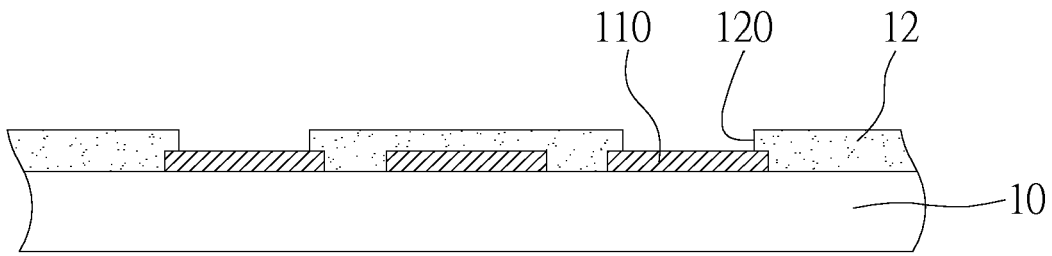
Figure 2A:
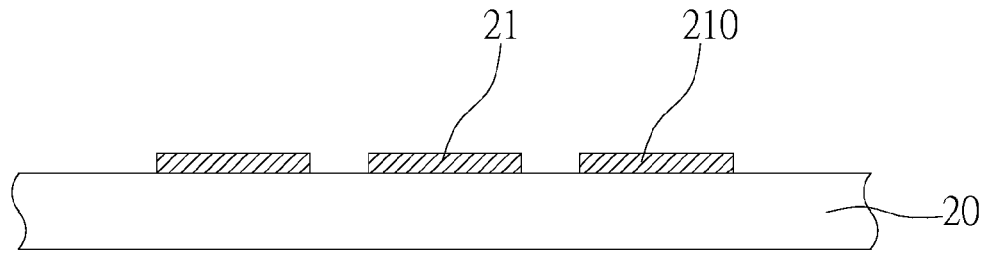
FIGS. 2A through 2I are cross-sectional views showing the first embodiment of a fabrication method of a circuit board structure according to the present invention.

As shown in FIG. 2A, the first embodiment of a fabrication method of a circuit board structure according to the present invention comprises providing a carrier board 20 with at least one surface formed with a circuit layer 21 having a plurality of electrically connecting pads 210.

Figure 2B:
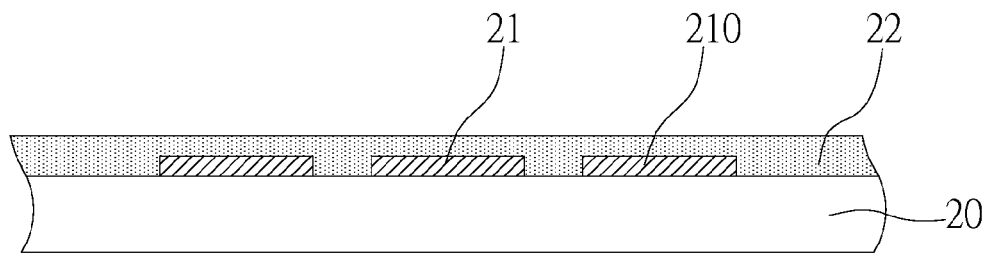

As shown in FIG. 2B, forming a first solder mask 22 on top of the carrier board 20 and the circuit layer 21 by means of printing, spin coating, or laminating, such that the first solder mask 22 is higher than the top of the circuit layer 21. The solder mask 22 is made of a high-insulation photosensitive material characterized by presence or absence of impurities, such as microparticles.

Figure 2C:
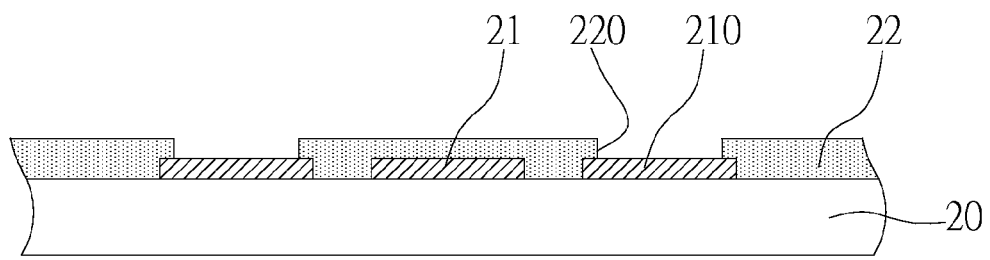

As shown in FIG. 2C, forming a plurality of first openings 220 in the first solder mask 22 by a patterning process to expose the electrically connecting pads 210.

Figure 2D:
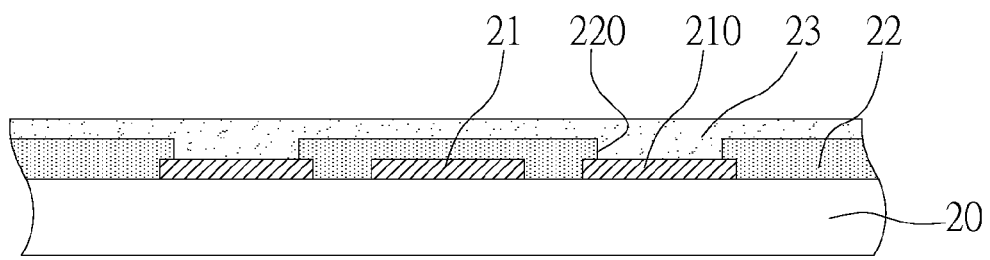

As shown in FIG. 2D, forming a second solder mask 23 on top of the first solder mask 22. The second solder mask 23 is made of a photosensitive material which is waterproof. Dielectric constants of the first and the second solder masks 22 and 23 fall within 2 to 3.2.

Figure 2E:
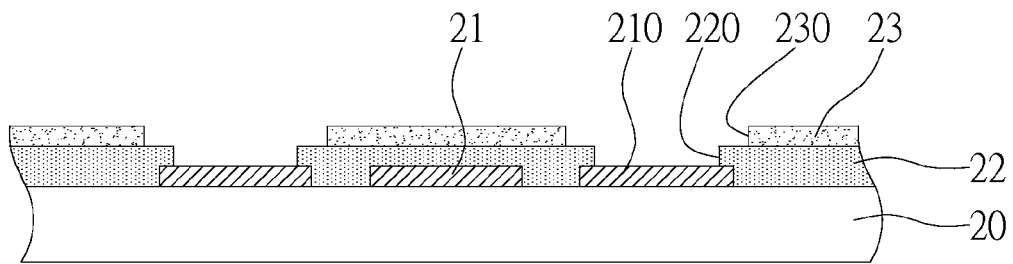

As shown in FIG. 2E, forming a plurality of second openings 230 in the second solder mask 23 by a patterning process to expose the first openings 220 and the electrically connecting pads 210. The diameter of each of the second openings 230 is larger than the diameter of each of the first openings 220. The total thickness of the first and the second solder masks 22 and 23 is less than the thickness of a single-layered solder mask of the prior art. Thicknesses of the first and the second solder masks 22 and 23 fall within 3 to 11 µm. Therefore, the present fabrication method enables design of fine pitches between conductive elements, decreases the overall thickness of a packaged circuit board structure and thereby is applicable to fine circuit layer fabrication, and reduces total fabrication cost.

Figure 2F:
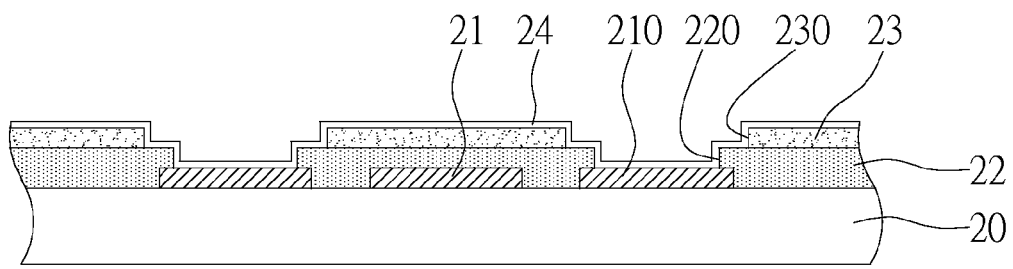

As shown in FIG. 2F, forming a conductive layer 24 on the surfaces of the second solder mask 23, the first openings 220, the second openings 230, and the electrically connecting pads 210. The conductive layer 24 is formed by means of chemical deposition such as electroless plating, physical vapor deposition such as sputtering, chemical vapor deposition, or others. The conductive layer 24 mainly functions as an electrical conduction path for subsequently electroplating a metal material. The conductive layer 24 is made of a metal or an alloy, or comprises multiple deposited metal layers, comprising one selected from the group consisting of copper, tin, nickel, chromium, titanium, copper-chromium alloy, and tin-lead alloy. In addition, the conductive layer 24 can be made of a polymer filled with a conductive material, or can be made of conductive polymers, such as polyacetylene, polyphenylamine, and organic sulfur polymer.

Figure 2G:
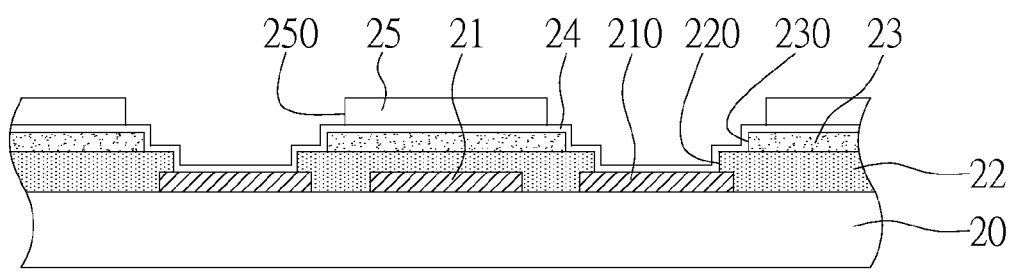

As shown in FIG. 2G, the fabrication method comprises forming a resist layer 25 on top of the conductive layer 24. The resist layer 25 is a photoresist layer that is a dry membrane, a liquid photoresist, or others, and is formed on the conductive layer 24 by means of printing, spin coating, laminating or others. The fabrication method further comprises forming a plurality of third openings 250 in the resist layer 25, by a patterning process which involves exposing, developing, and others, to expose the conductive layer 24 inside the first openings 220 and the second openings 230.

Figure 2H:
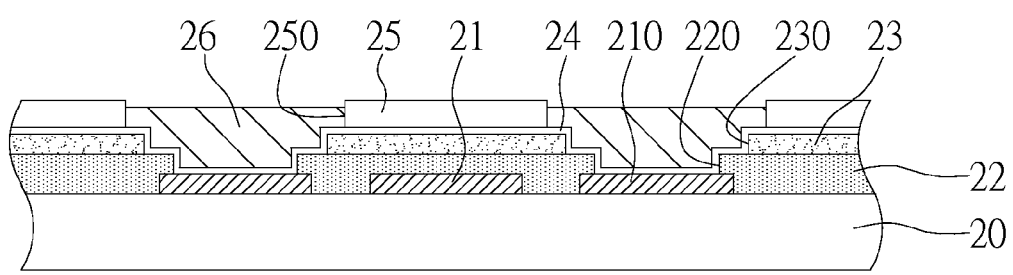

As shown in FIG. 2H, forming, inside the third openings 250 of the resist layer 25, conductive elements 26, such as solder balls and conductive bumps, on the conductive layer 24 on the surfaces of the electrically connecting pads 210, the first openings 220, and the second openings 230 by electroplating, for electrical connection with other electronic devices via the conductive elements 26.

Figure 2I:
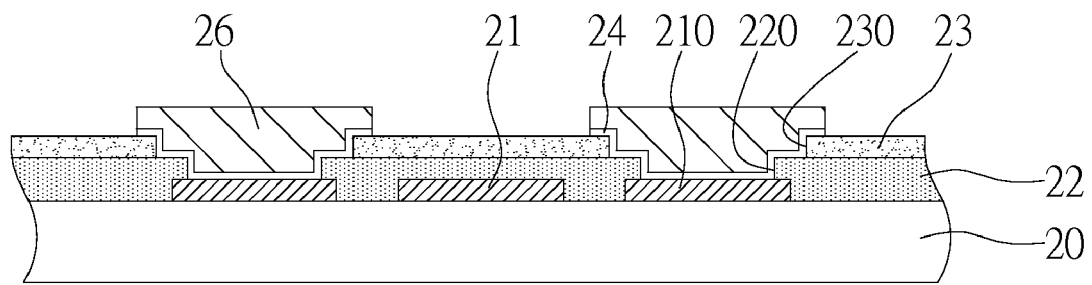

As shown in FIG. 2I, the resist layer 25 and the conductive layer 24 covered therewith are removed to expose the conductive elements 26.

In accordance with the foregoing fabrication method, the present invention further provides a circuit board structure comprising: a carrier board 20 with at least one surface formed with a circuit layer 21, the circuit layer 21 having a plurality of electrically connecting pads 210; a first solder mask 22 formed on top of the carrier board 20 and the circuit layer 21 and formed with a plurality of first opening 220 to expose the electrically connecting pads 210, wherein the first solder mask 22 is higher than the top of the circuit layer 21; and a second solder mask 23 formed on top of the first solder mask 22 and formed with a plurality of second openings 230 to expose the first openings 220 and the electrically connecting pads 210.

In addition, the circuit board structure of the present invention further comprises conductive elements 26, e.g. solder balls or conductive bumps, formed on the electrically connecting pads 210 inside the first openings 220 and the second openings 230. A conductive layer 24 is formed between the electrically connecting pads 210 and the conductive elements 26.

The first solder mask 22 is made of a high-insulation photosensitive material characterized by presence or absence of impurities, such as microparticles, thus providing enhanced fluidity for the first solder mask to be filled in the circuit layer. The impurities, if present, of the first solder mask 22 are microparticles and thereby enhance the insulation of the first solder mask 22, thus preventing metal ions migration and subsequent metal hyphae electricity discharge which might otherwise affect electrical performance. Therefore, the present invention is applicable to fine circuit fabrication. Furthermore, diameter of the second openings 230 of the second solder mask 23 is generally larger than diameter of the first openings 220 of the first solder mask 22. Total thickness of the first and the second solder masks 22 and 23 is less than thickness of a conventional single-layered solder mask. Therefore, the present invention is capable of providing designs of fine pitches between conductive elements 26, thus is applicable to fine circuit layer fabrication and further reduces total fabrication cost.

Second Embodiment

Please refer to FIGS. 3A through 3H, which are cross-sectional views illustrating the second embodiment of a fabrication method of a circuit board structure of the present invention.

Figure 3A:
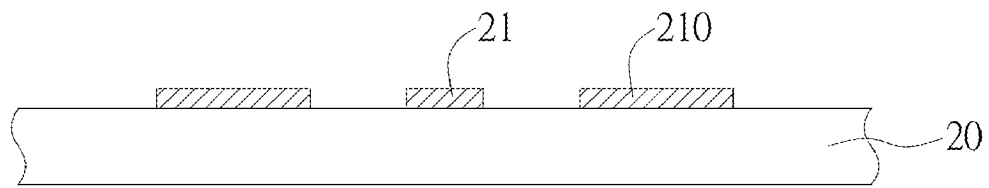
FIGS. 3A through 3I are cross-sectional views showing the second embodiment of a fabrication method of a circuit board structure according to the present invention.

As shown in FIG. 3A, the second embodiment of a fabrication method of a circuit board structure of the present invention comprises providing a carrier board 20 (which is the same as the carrier board 20 in the first embodiment) with at least one surface formed with a circuit layer 21 having a plurality of electrically connecting pads 210.

Figure 3B:
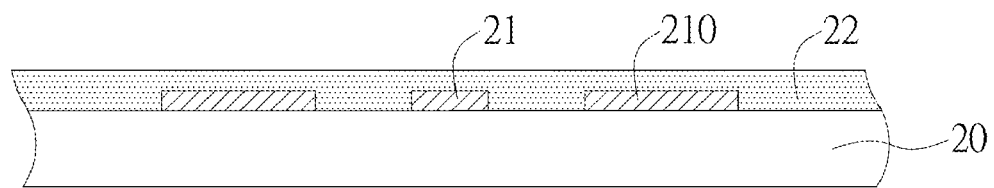

As shown in FIG. 3B, forming a first solder mask 22 on top of the carrier board 20 and the circuit layer 21 such that the first solder mask 22 is higher than the top of the circuit layer 21. The first solder mask 22 is made of a high-insulation photosensitive material characterized by presence or absence of impurities, such as microparticles.

Figure 3C:
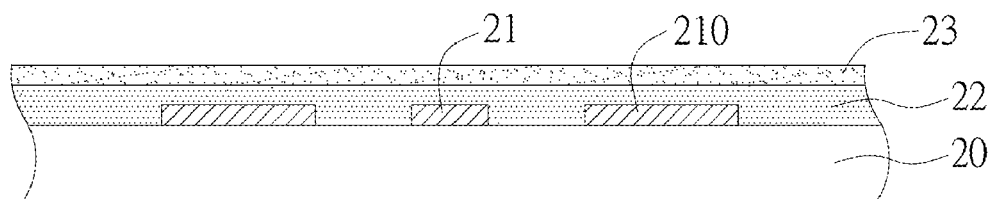

As shown in FIG. 3C, forming a second solder mask 23 on top of the first solder mask 22. The second solder mask 23 is made of a photosensitive material which is waterproof. Dielectric constants of the first solder mask 22 and the second solder mask 23 fall within 2 to 3.2.

Figure 3D:
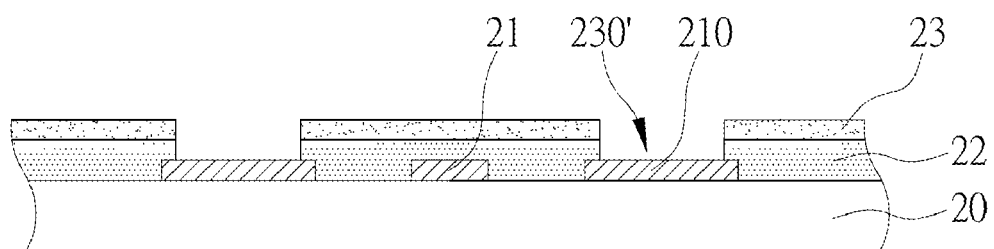

As shown in FIG. 3D, forming, by a patterning process, a plurality of solder mask openings 230' penetrating the first solder mask 22 and the second solder mask 23 to expose the electrically connecting pads 210. Thicknesses of the first solder mask 22 and the second solder mask 23 fall within 3 to 11 μm.

Figure 3E:
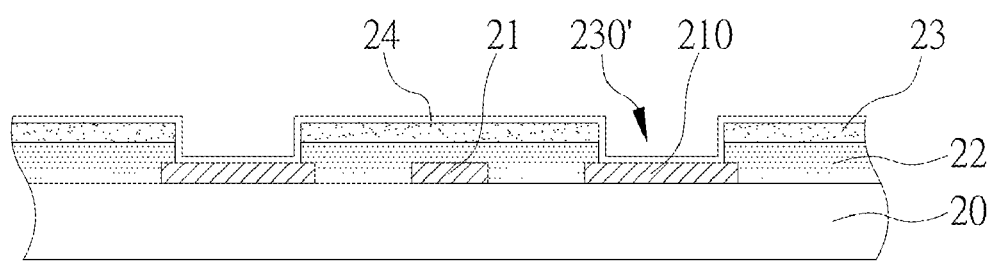

As shown in FIG. 3E, forming a conductive layer 24 on the surfaces of the electrically connecting pads 210, the surfaces of the second solder mask 23, and the solder mask openings 230'.

Figure 3F:
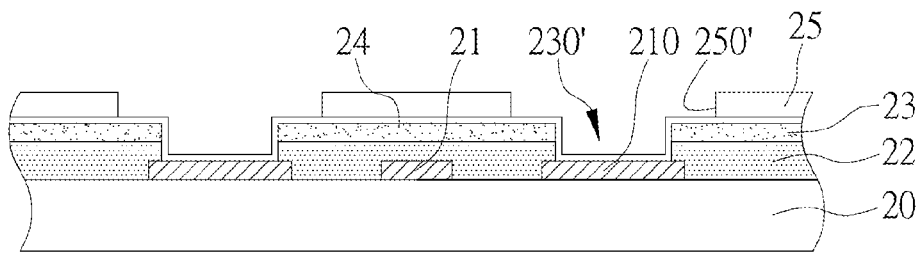

As shown in FIG. 3F, a method for fabricating the second embodiment of a circuit board structure of the present invention further comprises forming a resist layer 25 on the surface of the conductive layer 24, and forming by a patterning process a plurality of resist layer openings 250' in the resist layer 25 to expose the conductive layer 24 on the electrically connecting pads 210 and inside the solder mask openings 230'.

Figure 3G:
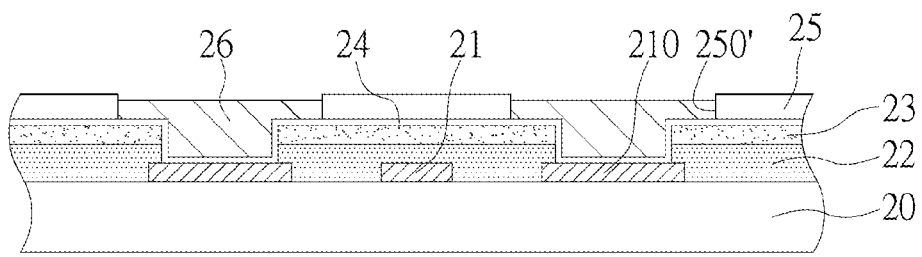
Figure 3H:
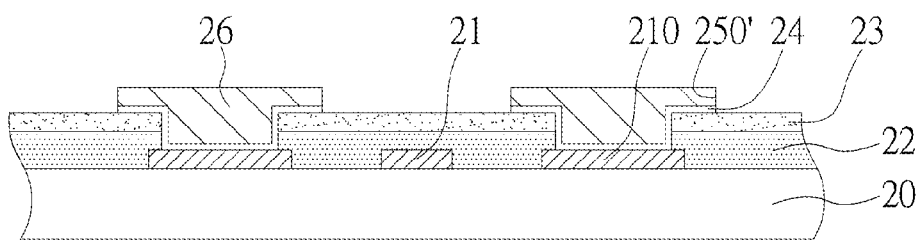

As shown in FIG. 3G, forming, inside the resist layer openings 250', conductive elements 26, such as solder balls and conductive bumps, on the conductive layer 24 formed inside the solder mask opening 230' and on the surface of the electrically connecting pad 210, by electroplating. As shown in FIG. 3H, a method for fabricating the second embodiment of a circuit board structure of the present invention further comprises removing the resist layer 25 and the conductive layer 24 covered therewith, so as to expose the conductive elements 26 for electrical connection with another electronic device.

Figure 3I:
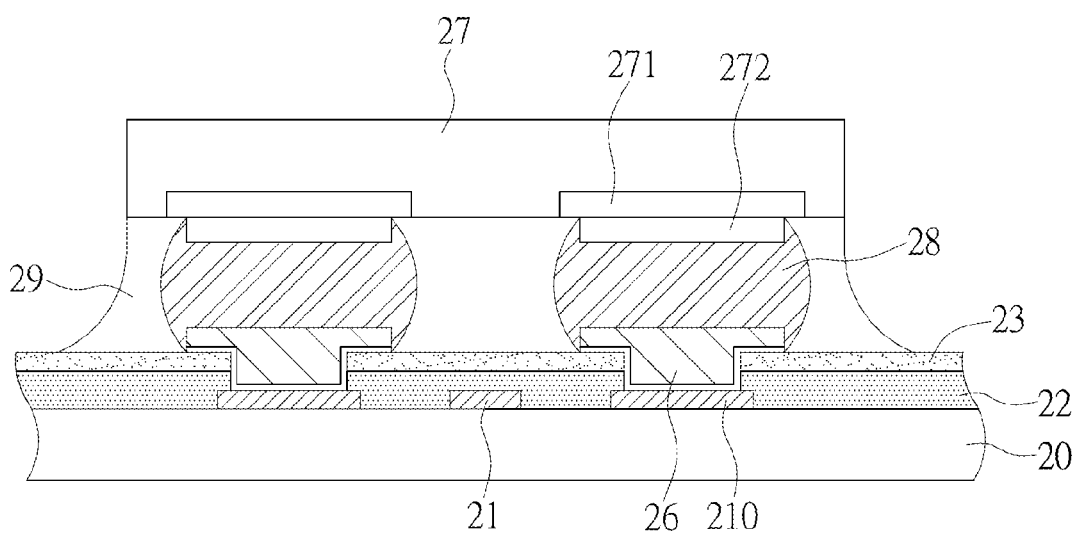

As shown in FIG. 3I, a method for fabricating the second embodiment of a circuit board structure of the present invention further comprises providing a semiconductor chip 27 having electrode pads 271, forming bumps 272 on the electrode pads 271, electrically connecting the bumps 272 to the conductive elements 26 via a conductive material 28, forming a bottom glue 29 between the semiconductor chip 27 and the second solder mask 23, thus allowing the conductive elements 26 to be electrically connected to the semiconductor chip 27.

In view of the above, the circuit board structure and a fabrication method of the same in accordance with the present invention involves providing a first solder mask, which exhibits high insulation, high fluidity, and high fillability, formed on a surface of a carrier board to be filled in a circuit layer, thus providing complete separations between line and line, line and electrically connecting pad, as well as electrically connecting pad and electrically connecting pad, and then preventing metal ions migration and subsequent metal hyphae electricity discharge which might otherwise affect electrical performance. Hence, the circuit board structure and the fabrication method of the same in accordance with the present invention is fit for fine circuit layer fabrication. In addition, the second solder mask, which is waterproof, is subsequently formed on top of the first solder mask, provides circuit layer that is covered by the first solder mask with well protection from vapor, also the total thickness of the first and the second solder masks is less than the thickness of a conventional single-layered solder mask, therefore the present invention is capable of providing designs of fine pitches between conductive elements and decreasing the overall thickness of a fabricated circuit board structure, thus is applicable to fine circuit layer fabrication and further reduces total fabrication cost.

The foregoing descriptions of the detailed embodiments are only illustrated to disclose the features and functions of the present invention and not restrictive of the scope of the present invention. It should be understood to persons skilled in the art that all modifications and variations made according to the spirit and principle in the disclosure of the present invention should fall within the scope of the appended claims.

What is claimed is:

1. A circuit board structure, comprising:
a carrier board with at least one surface formed with a circuit layer, the circuit layer having a plurality of electrically connecting pads;
a first solder mask formed on top of the carrier board and the circuit layer, being higher than the top of the circuit layer, formed with a plurality of first openings for exposing the electrically connecting pads, and being made of a high-insulation photosensitive material;
a second solder mask formed on top of the first solder mask, formed with a plurality of second openings for correspondingly exposing the electrically connecting pads beneath the first openings, and being made of a waterproof photosensitive material; and
conductive elements formed inside the first and the second openings and electrically connected to the electrically connecting pads, wherein the conductive elements are solder balls or conductive bumps.

2. The circuit board structure of claim 1, further comprising a conductive layer formed between the electrically connecting pads, sidewall of the first openings, sidewall of the second openings and the conductive elements.

3. The circuit board structure of claim 1, wherein the first solder mask has impurities.

4. The circuit board structure of claim 1, wherein dielectric constants of the first and the second solder masks range from 2 to 3.2.

5. The circuit board structure of claim 1, wherein thicknesses of the first and the second solder masks range from 3 to 11 μm.

6. The circuit board structure of claim 1, wherein the conductive elements serve to mount a semiconductor chip with electrode pads, the electrode pads having bumps formed thereon, the bumps being electrically connected to the conductive elements via a conductive material, wherein a bottom glue is formed between the semiconductor chip and the second solder mask.

* * * * *